United States Patent
Sonwalkar

(10) Patent No.: US 11,851,743 B1
(45) Date of Patent: Dec. 26, 2023

(54) METAL NANOPARTICLE FABRICATION ON TCO FOR PLASMONIC INTERACTION OF PHOTONS

(71) Applicant: SunDensity, Inc., Boston, MA (US)

(72) Inventor: Nishikant Sonwalkar, Boston, MA (US)

(73) Assignee: SunDensity, Inc., Boston, MA (US)

( * ) Notice: Subject to any disclaimer, the term of this patent is extended or adjusted under 35 U.S.C. 154(b) by 0 days.

(21) Appl. No.: 18/357,334

(22) Filed: Jul. 24, 2023

Related U.S. Application Data

(60) Provisional application No. 63/399,313, filed on Aug. 19, 2022.

(51) Int. Cl.
| | |
|---|---|
| H01L 31/055 | (2014.01) |
| C23C 14/08 | (2006.01) |
| C23C 14/14 | (2006.01) |
| C23C 14/56 | (2006.01) |
| C23C 14/58 | (2006.01) |
| H01L 31/048 | (2014.01) |
| C23C 14/34 | (2006.01) |
| H01L 31/18 | (2006.01) |
| B82Y 40/00 | (2011.01) |
| B82Y 20/00 | (2011.01) |
| C23C 14/02 | (2006.01) |

(52) U.S. Cl.
CPC .......... *C23C 14/086* (2013.01); *B82Y 20/00* (2013.01); *B82Y 40/00* (2013.01); *C23C 14/022* (2013.01); *C23C 14/14* (2013.01); *C23C 14/34* (2013.01); *C23C 14/568* (2013.01); *C23C 14/5846* (2013.01); *H01L 31/048* (2013.01); *H01L 31/186* (2013.01)

(58) Field of Classification Search
CPC ............ G02B 2207/101; H01L 31/055; H01L 31/0547
See application file for complete search history.

(56) References Cited

U.S. PATENT DOCUMENTS

| | | | |
|---|---|---|---|
| 10,935,707 B1 * | 3/2021 | Sonwalkar | C09K 11/59 |
| 2003/0013280 A1 * | 1/2003 | Yamanaka | H01L 21/0242 |
| | | | 257/E29.294 |
| 2015/0114445 A1 * | 4/2015 | Wu | H01L 31/18 |
| | | | 136/244 |
| 2016/0139476 A1 * | 5/2016 | Garcia | G02F 1/0123 |
| | | | 359/275 |

* cited by examiner

*Primary Examiner* — Jaehwan Oh

(74) *Attorney, Agent, or Firm* — Louis S. Horvath

(57) ABSTRACT

A method for nanoparticle fabrication deposits a seed layer of a transparent conductive oxide onto a substrate and deposits a layer of a plasmonic metal onto the transparent conductive oxide layer. The method forms nanoparticles from the deposited metal by transporting the substrate along a transport path and, as the substrate is moving, energizing one or more flash lamps disposed along the transport path to apply a plurality of light pulses that impart a dewetting energy to the deposited metal layer.

20 Claims, 19 Drawing Sheets

| Material | AZO | AZO | AZO |
|---|---|---|---|
| Thickness | 80 nm | 80 nm | 80 nm |
| Pre-pulse (msec) | 6.5 | 6.5 | 6.5 |
| kV | 2.0 | 2.0 | 2.0 |
| Main pulse (msec) | 3.5 | 3.5 | 3.5 |
| kV | 4.2 | 4.2 | 4.2 |
| Speed (m/sec) | 0.20 | 0.20 | 0.20 |
| # pulses | 8 | 8 | 8 |

| Material | Ag | Ag | Ag |
|---|---|---|---|
| Thickness | 4.0 nm | 4.0 nm | 4.0 nm |
| Pre-pulse (msec) | 6.5 | 6.5 | 6.5 |
| kV | 2.0 | 2.0 | 2.0 |
| Main pulse (msec) | 3.5 | 3.5 | 3.5 |
| kV | 4.2 | 4.2 | 4.2 |
| Speed (m/sec) | 0.40 | 0.20 | 0.13 |
| # pulses | 8 | 8 | 8 |

FLA width: 30mm
Delta flash: 1129 msec

FIG. 9

METAL NANOPARTICLE FABRICATION ON TCO FOR PLASMONIC INTERACTION OF PHOTONS

The present application claims the benefit of U.S. Provisional Application Ser. 63/399,313 entitled "METAL NANOPARTICLE FABRICATION ON TCO FOR PLASMONIC INTERACTION OF PHOTONS" by Nishikant Sonwalkar, filed 19 Aug. 2022 and incorporated herein in its entirety.

TECHNICAL FIELD

This disclosure generally relates to photonic optical coatings and more particularly to conditioning of semiconductor dialectric materials for photonic down conversion and in situ generation of metal nanoparticles of the desired dimensions and distribution for enhanced plasmonic response to photon flux.

BACKGROUND ART

Nanoparticles have been shown effective for enhancing plasmonic interaction of thin-film surfaces, such as by increasing the surface area of metal structures that support plasmonic behavior. Research over the past 30 years has revealed that nanoparticles of silver and gold can be particularly useful for Raman spectroscopic observation of organic molecules. Surface plasmonic resonance appears to be induced from incoming electromagnetic radiation with localization of the electric field as a result of the interaction of light with nanoparticles of various shapes, such as with spherical, oblate or prolate shapes, and with appropriate size, shape, and distribution parameters.

Using conventional techniques, nanoparticles for plasmonic response have been separately generated, such as in a liquid medium by a chemical process for example, then subsequently applied to the thin-film surface. Nanoparticles for this purpose have been generated using various precipitation chemistry techniques, by sol-gel methods, using pulsed laser application, or by thermal annealing of sputtered nano-layers of noble metals, e.g. silver (Ag) or gold (Au). While these conventional approaches can provide suitable sizes of nanoparticles, most of these processes are inefficient and generally slow, often requiring considerable time to form nanoparticles (NPs) of suitable size. Moreover, conventional methods require a two step process: first, for fabricating the nanoparticles; second, for applying, distributing, and coupling the nanoparticles to a target surface. Application of nanoparticles to a treated surface, with the NPs having the desired dimensions and distribution for plasmonic behavior, has proved to be expensive, with accurate, repeatable results difficult to obtain. Due to complexity and cost, conventional processes for nanoparticle formation on film have been shown to be poorly suited to higher volume fabrication and are not promising solutions for providing a continuous, in-line fabrication process.

Currently, precipitation chemistry or thin-film sintering or annealing treatments for nanoparticle generation are largely batch processes, with the NPs formed in solution or on an intermediate surface, followed by successive steps of layer deposition and application on the intended substrate for plasmonic use. The conventional steps needed to form NPs as part of a process that is separate from thin film deposition and conditioning have been shown to be poorly suited to any type of continuous fabrication arrangement. This complexity, and the accompanying cost thresholds that are imposed, effectively prevent many types of plasmonic surfaces from being commercially viable, presenting barriers against broader use and limiting the potential adaptation of these capable photonic materials.

Thus, there is a need for improved techniques for metal nanoparticle fabrication on semiconductor dielectric materials in an in-line process to support more efficient fabrication of responsive plasmonic surfaces.

SUMMARY OF INVENTION

It is an object of the present disclosure to advance the art of nanoparticle generation for noble metals and nanoparticle distribution on semiconductor dielectric material surfaces. With this object in mind, embodiments of the present disclosure provide a process for fabrication of photonic surfaces that exhibit plasmonic response to light photons, the process comprising:
  depositing a seed layer of a transparent conductive oxide onto a substrate;
  depositing a layer of a plasmonic metal onto the transparent conductive oxide layer;
  and
  forming nanoparticles from the deposited metal by:
  transporting the substrate along a transport path;
  as the substrate is moving, energizing one or more flash lamps disposed along the transport path to apply a plurality of light pulses that impart a dewetting energy to the deposited metal layer.

Advantageously, according to a method of the present disclosure, annealing to generate the metal nanoparticles can be done in a vacuum chamber environment, with flash lamp annealing used to expose a moving substrate.

INDUSTRIAL APPLICABILITY

According to a broad aspect of the present disclosure, apparatus and methods are provided for improved fabrication of photonic materials having metal nanoparticles for forming photonic coatings for solar panels and other light-responsive components.

The resulting in-line generation of noble metal nanoparticles, concomitant with conditioning of dielectric semiconductor material, can help to fabricate photonic optics for improved wavelength management, such as for wavelength down-conversion and up-conversion with enhanced plasmonic response. Products and services that can use these materials can include solar PV (photo-voltaic) panels, low-emissivity glass and window glass, building integrated PV, green-house glass with spectral management for crop growth, light sensors, and sub-wavelength optics with plasmonic components and surfaces, for example.

BRIEF DESCRIPTION OF DRAWINGS

FIG. 9 is a table showing parameters used to generate an enhanced plasmonic surface according to embodiments of the present disclosure.

DESCRIPTION OF EMBODIMENTS

Figure 1:
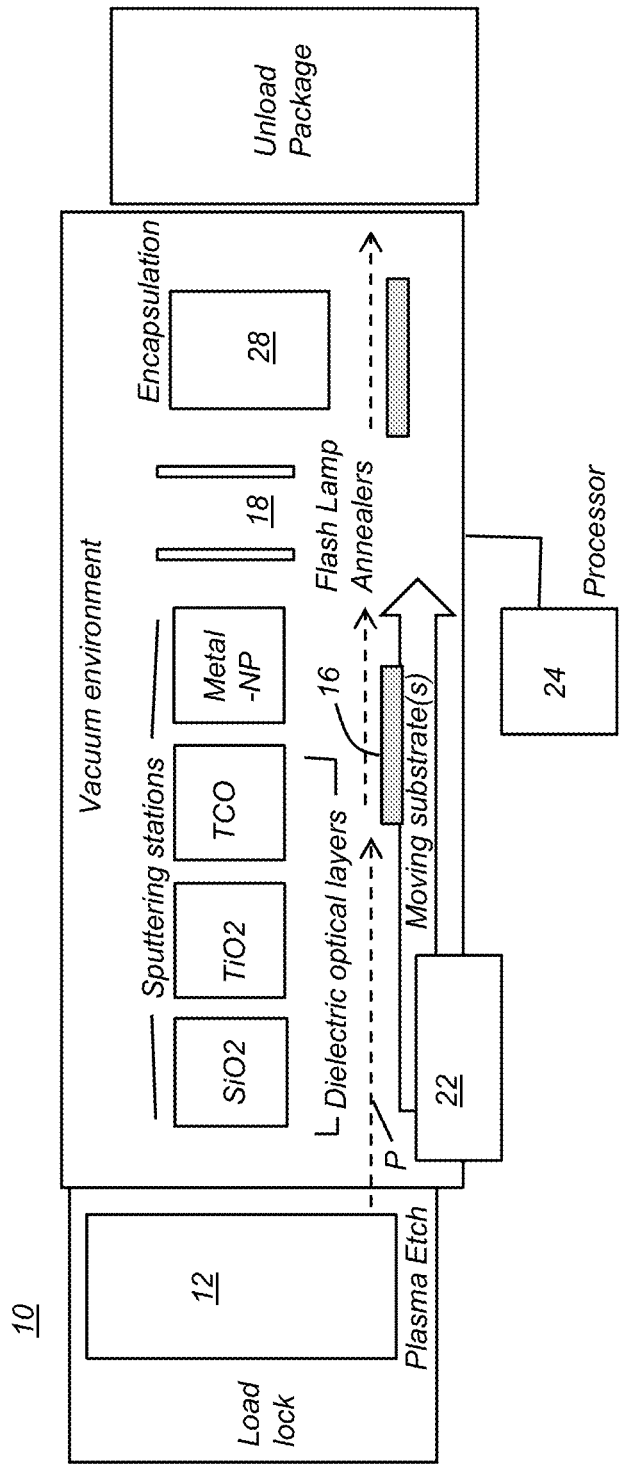
FIG. 1 is a simplified schematic showing use of an in-line annealing process for plasmonic surface generation.

Figures shown and described herein illustrate key principles of operation and fabrication for photonic film and apparatus according to various embodiments and are not drawn with intent to show actual size or scale. Some visual exaggeration may be necessary in order to emphasize basic structural relationships or principles of operation.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light in different planes, for example, but do not indicate any required orientation of components with respect to true horizontal and vertical orientation.

Where they are used, the terms "first", "second", "third", and so on, do not necessarily denote any ordinal or priority relation, but are used for more clearly distinguishing one element or time interval from another. For example, there are no fixed "first" or "second" elements in what is taught herein; these descriptors are merely used to clearly distinguish one element from another similar element in the context of the present disclosure.

In the context of the present disclosure, the term "film" can be used to mean a coating that is applied to a substrate as one or more thin layers, such as a thin-film optical coating formed from successively formed layers of materials treated to have different indices of refraction. A film can also be a sheet of a light-propagating substrate formed of one or more layers of optical materials and used in standalone fashion or optically coupled to another optical component, such as using an adhesive. The thickness of a film can vary over a range; the behavior of an optical film is primarily related to its treatment of, or response to, light incident on the broad, 2-dimensional surface of the film.

As used herein, the term "energizable" relates to a device or set of components that perform an indicated function upon receiving power and, optionally, upon receiving an enabling signal.

Noble metal (such as Silver and Gold) nanoparticles have found numerous applications for modifying and enhancing plasmonic response to photon flux. Embodiments of the present disclosure develop methods for generating metal nanoparticles on light-transmissive, transparent conducting metal oxide (TCO) layers using a flash lamp energy, as described in more detail subsequently. In the context of the present disclosure, the phrase "plasmonic metals" refers to metal elements that can be used to generate nanoparticles that provide enhanced plasmonic response; plasmonic metals of high interest in this category include silver, gold, copper, and aluminum.

A plasmonic effect is an optoelectronic effect in which free electrons in a metal collectively oscillate in response to external light. This effect appears to occur as the result of a resonance phenomenon in which most of the light energy of incident light having a certain wavelength is shifted to free electrons. The resonance phenomenon occurs between a metal having a negative dielectric constant and a high conductivity and a general insulator material having a positive dielectric constant. When the frequency of incident light equals the natural frequency of the surface plasmon of a metal, most of the incident light is absorbed.

Plasmons are oscillations of free electrons that are the consequence of the formation of a dipole in the material due to electromagnetic waves. The electrons migrate in the material to restore its initial state; however, the light waves oscillate, leading to a constant shift in the dipole that forces the electrons to oscillate at the same frequency as the light. This coupling only occurs when the frequency of the light is equal to or less than the plasma frequency and is greatest at the plasma frequency that is therefore called the resonant frequency. The scattering and absorbance cross-sections describe the intensity of a given frequency to be scattered or absorbed.

With regard to plasmonic metal nanoparticles, the electric field of visible light or near-infrared light may be paired with a plasmon to cause light absorption, thereby achieving a vivid color, for example. This is one possible effect of surface plasmon resonance, with local formation of a highly increased electric field as light energy is transformed by a surface plasmon and is accumulated on the surfaces of metal nanoparticles. This also permits optical control within a region smaller than the diffraction limit of light.

Plasmonic metal nanoparticles strongly and distinctively interact with an electromagnetic wave due, for example, to the surface plasmon resonance phenomenon. Using this behavior allows a light absorption band to be amplified and controlled.

Metal nanoparticles exhibiting plasmon resonance are particles whose electron density can couple with electromagnetic radiation of wavelengths that are far larger than the particle due to the nature of the dielectric-metal interface between the nanoparticles and the semiconductor medium in which the nanoparticles are disposed. Metal nanoparticles having plasmon resonance can exhibit potentially interesting and useful scattering, absorbance, and coupling properties based on their NP geometries and relative positions or distribution. In standard practice, methods for forming plasmon metal nanoparticles generally achieve nanoparticle sizes of 100 nm or less with a level of size uniformity sufficient for providing plasmonic response at a given resonance wavelength.

Embodiments of the present disclosure address the need for less costly and more efficient methods for plasmonic metal nanoparticle (NP) formation, as well as the need for conditioning the deposited semiconductor dielectric TCO material on which on plasmonic metal NPs are formed by using flash lamp annealing (FLA) on a moving substrate. The applied FLA energy simultaneously performs the following:
  (i) conditions the dielectric TCO material for photonic conversion; and
  (ii) generates the metal NPs by a dewetting process.

Moreover, because embodiments of the present disclosure can apply the FLA energy to a continuously moving substrate, the fabrication methods described herein can offer significant gains in throughput, helping to lower the overall production costs for photonic films and components, as well as for the fabrication equipment itself. Dielectric materials that can be used as plasmonic host materials include various doped transparent conductive oxides (TCO) including AZO (Aluminum Zinc Oxide), ITO (Indium Tin Oxide), and others.

In-Line Processing Overview

FIG. 1 shows, in simplified schematic form, a photonic film fabrication apparatus for in-line fabrication of a multi-layer photonic film having a plasmonic surface of a substrate 16 using metal nanoparticle fabrication on TCO. Apparatus 10 obtains its materials for processing from a clean room environment, and can provide a series of cooperating modular subsystems that successively add layers to the photonic film product and condition one or more layers for plasmonic response. Modular portions of apparatus can provide heater and pretreatment support, for example, and can include one or more process stations where successive layers are deposited and treated for photonic behavior.

Fabrication apparatus 10 provides modular stations housed within a vacuum environment. A transport apparatus 22 can include drive motors and belts or other movable support surfaces for translating a substrate 16 along a transport path P that leads through each process station, obviating the need for manual handling and transfer of the substrate 16 during application of the multiple layers needed for forming the photonic film and maintaining a vacuum environment throughout the fabrication process, including controlled load lock for materials isolation and unload capabilities for the completed, fabricated component. A control logic processor 24, such as a computer system or dedicated, programmed logic processor or hard-wired controller is in communication with apparatus 10 components for control of each phase of the treatment sequence. An operator interface, not shown, can be provided to allow fabrication personnel to monitor the process and to make adjustments to timing, to energy levels, and to other variables, for example.

A pretreatment module 12 prepares the substrate surface for application of thin film coatings, such as using a plasma etch process, with anode/cathode cleaning, to pre-condition the surface for subsequent sputtering. This pretreatment can also include cleaning by sonication and other methods, for example.

Sputtering, using a physical vapor deposition process such as RF sputtering, can be used to apply the various layers of a photonic film. The FIG. 1 sequence shows a number of sputtering stations for applying a number of dielectric materials to the substrate 16 surface, including one or more successive layers of SiO2, TiO2 and a plasmonic host material, such as AZO or other TCO material. The plasmonic host material can act as a seed layer for forming NPs and can also be conditioned, using FLA, to serve as a photoluminescent down-converter (PLDC) for wavelength conversion. The Applicant has found use of such a seed layer to improve surface plasmon resonance for nanoparticles formed on an adjacent noble-metal surface.

A sputtering station also deposits the thin metal layer that is used for forming nanoparticles (NPs). The plasmonic metals that the Applicant has identified of most practical interest include silver Ag and others described hereinabove.

Following metal deposition, an FLA (Flash Lamp Annealing) module 18 then performs the energy transfer that is needed onto the moving substrate 16, in order to form the nanoparticles in the light-transmissive TCO layer. FLA can be performed using a single lamp. In practice, however, for annealing on a moving substrate as practiced herein, a bank of multiple flash lamps, spaced apart along transport path P, provides significantly more flexibility and energy delivery capabilities than are available with a single lamp.

Figure 2:
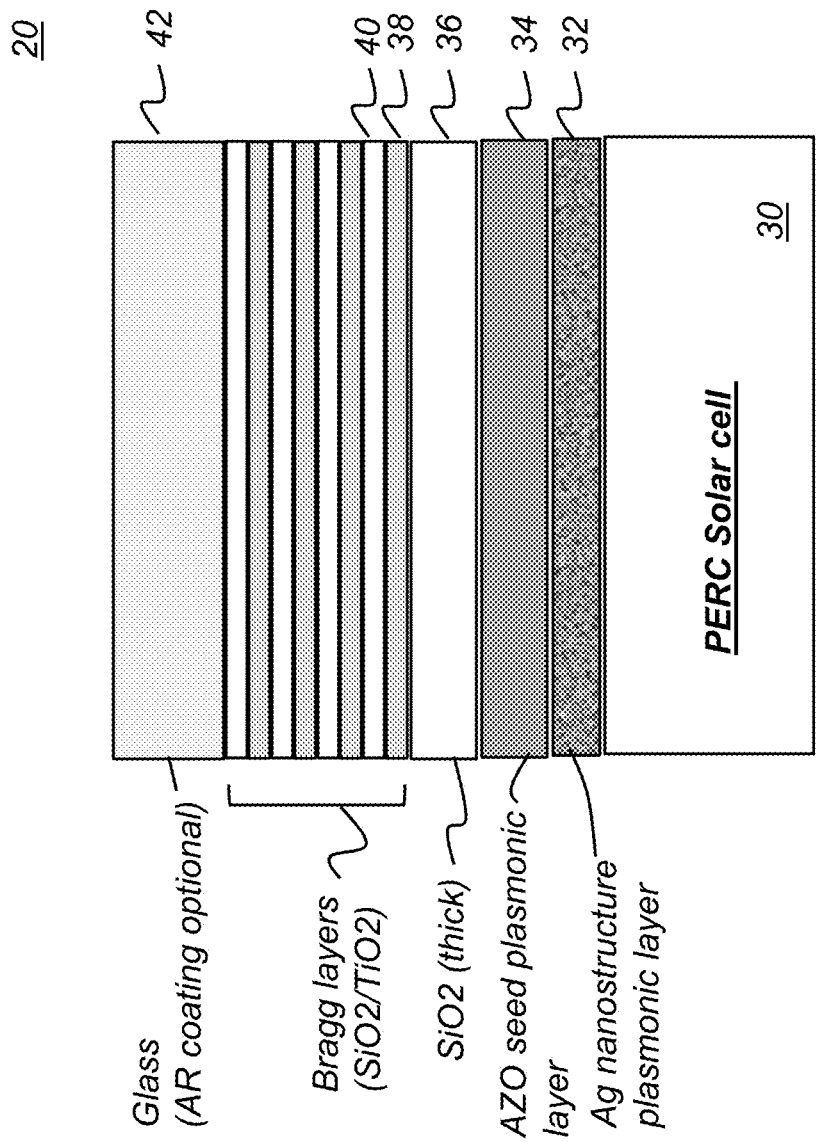
FIG. 2 is a cross-sectional, exploded view that shows layers formed according to an embodiment of the present disclosure.

An encapsulation module 28 can be used to deposit an encapsulation layer to the generated film. According to an embodiment of the present disclosure as shown in FIG. 2, the encapsulation layer 36 is formed from SiO2 deposition. Sputtering or other suitable deposition method can be used for encapsulation.

Apparatus 10 is shown configured to execute a continuous process. Within this process, a photonic component can be cycled multiple times through its various subsystems, such as to form a layered stack, as each component layer is deposited onto substrate 16 and conditioned. By way of example for fabrication of the photonic film product described subsequently, various process stations are configured for adding SiO2, AZO and Ag materials, and TiO2 layers. A flash lamp annealing (FLA) station or chamber, configured as FLA module 18, provides the needed energy to condition the TCO layer and to form plasmonic metal nanoparticle (NP) features onto the moving film substrate as it progresses and is transported through apparatus 10.

The capability to form nanoparticles in situ on a continuously moving film substrate has particular advantages for reducing overall fabrication time and allows a higher degree of efficiency for automated photonic film manufacturing than has been previously available. This arrangement, with the substrate in continuous motion, and under continuous vacuum, through each process station, can also help to reduce the size of various fabrication equipment used for applying materials, while still allowing multiple cycles through various deposition modules. According to an alternate embodiment of the present disclosure, substrate movement can be temporarily stopped, with the substrate momentarily held motionless at one or more process stations, such as when it might be preferred to deposit a particular film of material onto a stationary substrate surface. However, the Applicant's solution as shown in FIG. 1 allows a continuous process, with each materials application and conditioning treatment suitably timed for a smooth process flow in a controlled, clean, vacuum-isolated environment. Using the continuous flow provided by apparatus 10, multiple substrates 16 can be processed simultaneously, or separate portions of a single substrate 16 can be processed simultaneously at more than one station. Thus, for example, instead of being produced on separate plates or discrete lengths of film, a photonic film can be fabricated in continuous roll or web form, unwound from a roll form at loading and wound back onto the roll at unloading stations, facilitating subsequent shipping, handling, and configuration and coupling to other devices.

The cross-section view of FIG. 2 shows a stack structure for a type of film 20 that can be used to enhance the efficiency and performance of a solar cell energy photovoltaic (PV) generator having layers with plasmonic response and capable of being manufactured using the continuous process available using apparatus 10 of FIG. 1. (Layers can be formed onto a glass substrate 42, so that the film 20 structure is then flipped 180 degrees to provide the orientation and order of layers formed as shown in the FIG. 1 sequence.) The film structure can then be fabricated onto or otherwise coupled against a PERC (Passivated Emitter and Rear Contact) solar cell 30.

Nearest the solar cell 30 surface, a silver (Ag) nanostructure plasmonic layer 32 can be formed onto or for placement against the solar cell 30 surface. An AZO seed plasmonic layer 34 can then be applied; other TCO materials can alternately be used for layer 34, which can serve as both a seed layer and as a photoluminescent down converter (PLDC). A thick layer of SiO2 36 can be formed for encapsulation or passivation of the plasmonic features. A number of paired TiO2/SiO2 layers 38, 40 are then added to form a distributed Bragg reflector (DBR). A layer of glass 42 is applied, with or without anti-reflection (AR) treatment. An EVA (ethylene vinyl acetate) encapsulation of the solar cells can alternately be used.

With the layered film of FIG. 2, sunlight, transmitted through a modified Bragg layer arrangement of layer 38/40 pairs, is then directed to one or more localized surface plasmonic layers (LSPR) that further condition the light energy for use in the solar cell.

Figure 3A:
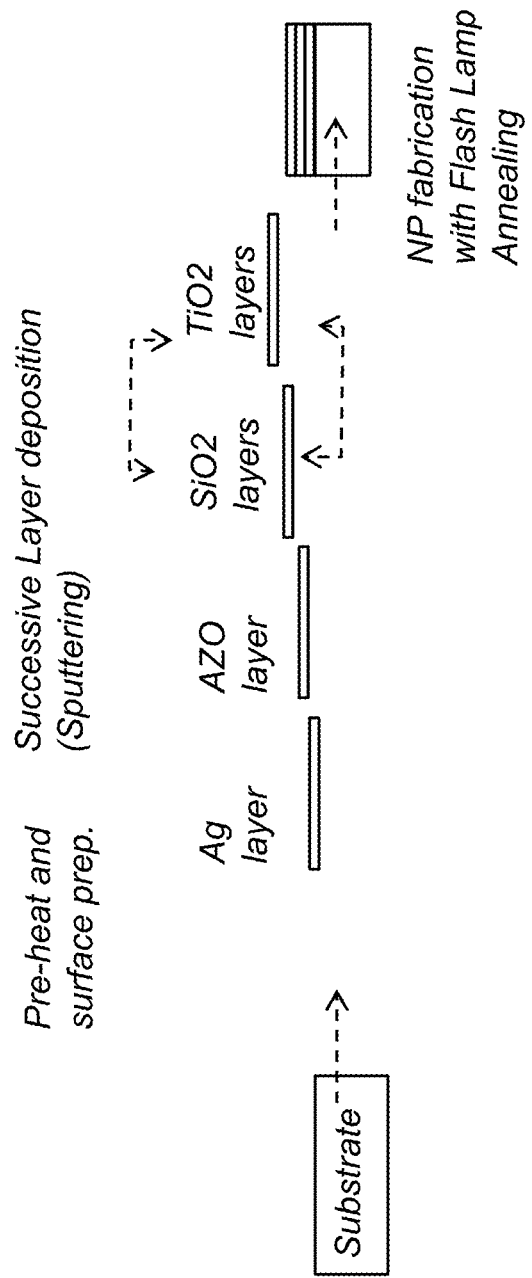
FIG. 3A is a flow chart that shows the processing sequence for a photonic film product of FIG. 2.

Unlike conventional workflow for multi-layer deposition and treatment, the apparatus of the present disclosure can generate film 20 in a continuous process. As us shown in the simplified schematic flow chart of FIG. 3A, the lay-down order can be reversed from that described with reference to FIG. 1. The substrate layer can be glass or, in reverse, can be an active device, such as a PV device. As in the FIG. 1 process, the substrate can be subjected to pre-heat and surface preparation, followed by successive application and treatment of layers for building up the stacked structure of FIG. 2. The sequencing of layers and treatment can be formed onto a glass 42 substrate as guided by the FIG. 2 structure or, in reversed order, onto the solar cell material as "substrate". FIG. 3A layers are formed and treated in one or more passes through the fabrication apparatus described with reference to FIG. 1. Continued cycling through the apparatus 10 of FIG. 1 enables the layered film configuration to be generated in a continuous manner, applying the needed film features for enhanced performance to successive sections or sheets of substrate, while maintaining full vacuum and clean-room conditions throughout the film fabrication process.

Figure 3B:
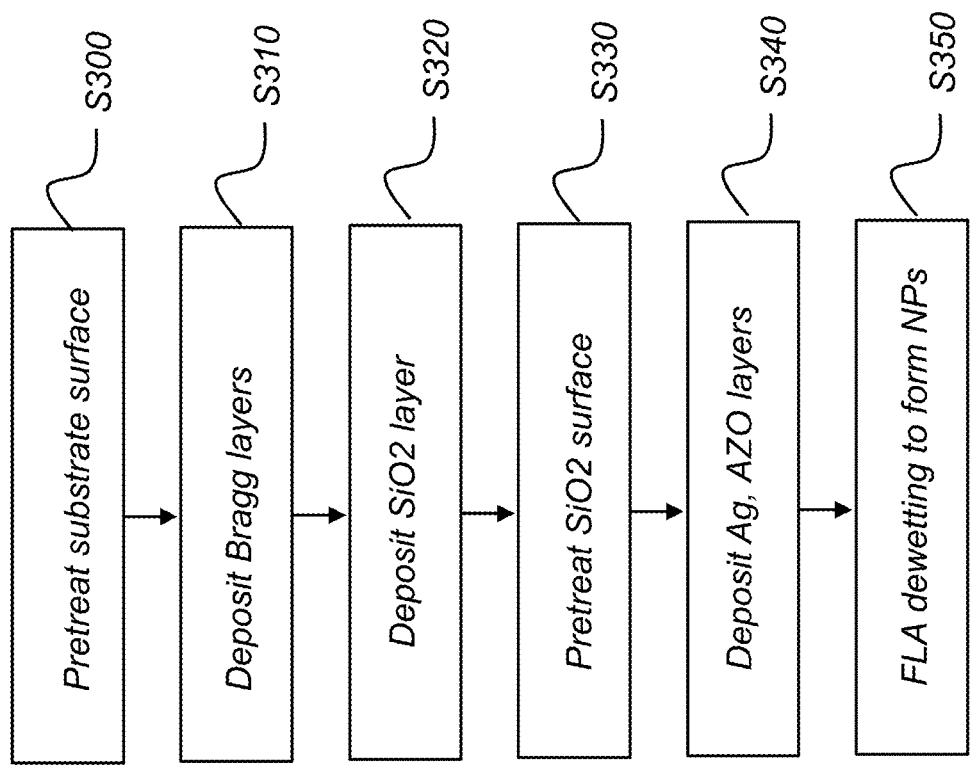
FIG. 3B is a flow diagram showing steps in photonic film fabrication according to an embodiment of the present disclosure.

The order of sputtering and FLA treatment processes can be varied based on the requirements for a particular photonic film. FIG. 3B is an exemplary flow diagram showing steps in photonic film fabrication according to an alternate embodiment of the present disclosure. Using the apparatus of FIG. 1, it can be seen that the photonic film that is being fabricated can pass through each of the process stations 14 any number of times in order to build up the sequence of layers needed to form film 20 of FIG. 2. Thus, the sequence shown in FIG. 3B is exemplary only; as with FIG. 3A, steps in the sequence could be reversed or re-ordered to form the multi-layered structure, depending on whether it is more suitable to add and condition the layers in one sequence or another. For example, the substrate can be reversed during the processing, so that applications of material treat opposite sides of the film substrate 16 in progress.

In the exemplary sequence of FIG. 3B, processing begins with a surface pretreatment step S300 that conditions the surface for layer deposition. A Bragg layer deposition step S310 can follow, successively depositing the SiO2 and TiO2 layers that form the Bragg stack. A silicon layer deposition step S320 then deposits a thicker layer of silicon to separate the Bragg section from the plasmonic features. A surface pretreatment step S330 conditions the surface for subsequent deposition of AZO, or other TCO, and Ag materials in a plasmonic layer deposition step S340. A dewetting step S350 then applies the flash lamp energy that generates the NP features on the surface.

Flash Lamp Annealing (FLA)

The Applicant method employs dewetting, using applied FLA energy, for forming nanostructures from noble metals. In dewetting processing, high energy levels are applied to the thin film surface, usually a surface of uniform thickness. The high energy FLA can be applied from a laser, electron beam, or other high-energy light or radiation source. The resulting dewetting transforms the thin film into droplet form by incrementally removing or re-patterning the noble metal that is on or within the layer substrate until nanostructures of the needed dimensions, morphology, and periodicity (spacing or distribution) are obtained.

Of particular interest to the Applicant is providing a dewetting apparatus that allows in situ formation of nanoparticles with continuous movement of the photonic film. According to an embodiment of the present disclosure, nanoparticle formation can be effected using high-energy pulses from a flash lamp source. The application of light energy in this manner causes a de-wetting effect on the thin Ag layer to form nanostructure plasmonic layer 32 (FIG. 2). The Applicant has found that the rate and amount of dewetting varies at least generally in proportion to the pulse ON/OFF timing and to the energy values obtained. In general, the longer the dewetting period, the smaller the generated particles and, consequently, the larger spacing between them. For photonics use, however, precise monitoring and adjustment are needed in order to form the NP structures and distribution that generate the needed plasmonic response for a particular coating.

Figure 4:
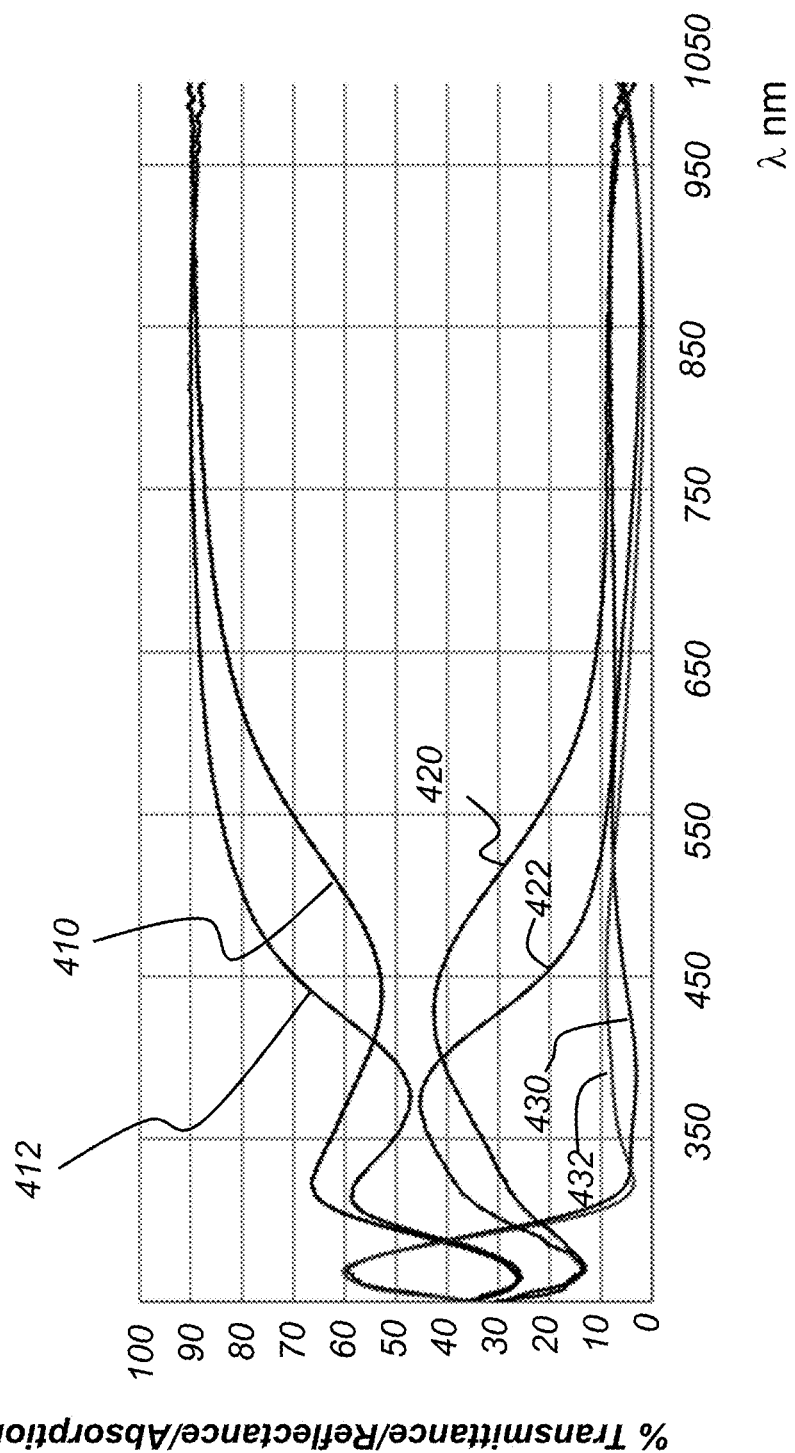
FIG. 4 is a graph that shows improved spectral response of annealed silver nanoparticle layer on AZO, pre- and post-annealing, over a spectral range from 350 nm to beyond 1050 nm.

FIG. 4 is a graph that shows improved spectral response at lower wavelengths using a flash-lamp-annealed silver nanoparticle layer on AZO, with pre- and post-annealing, over a spectral range from 350 nm to beyond 1050 nm. A curve 410 shows transmittance before flash lamp annealing. A curve 412 shows transmittance after flash lamp annealing and formation of nanoparticles. The shift from curve 410 to curve 412 shows the improvement in spectral response for shorter wavelength visible light.

Continuing with the FIG. 4 graph, a curve 420 shows absorption before flash lamp annealing. A curve 422 shows absorption after flash lamp annealing and consequent formation of nanoparticles. Again, a shift in curve position and shape relative to wavelength is observed, showing improved performance at shorter wavelengths.

In FIG. 4, a curve 430 shows reflection before flash lamp annealing. A curve 432 shows reflection after flash lamp annealing and formation of nanoparticles. As can be readily seen, reflection is improved over a range of shorter wavelengths.

Figure 5:
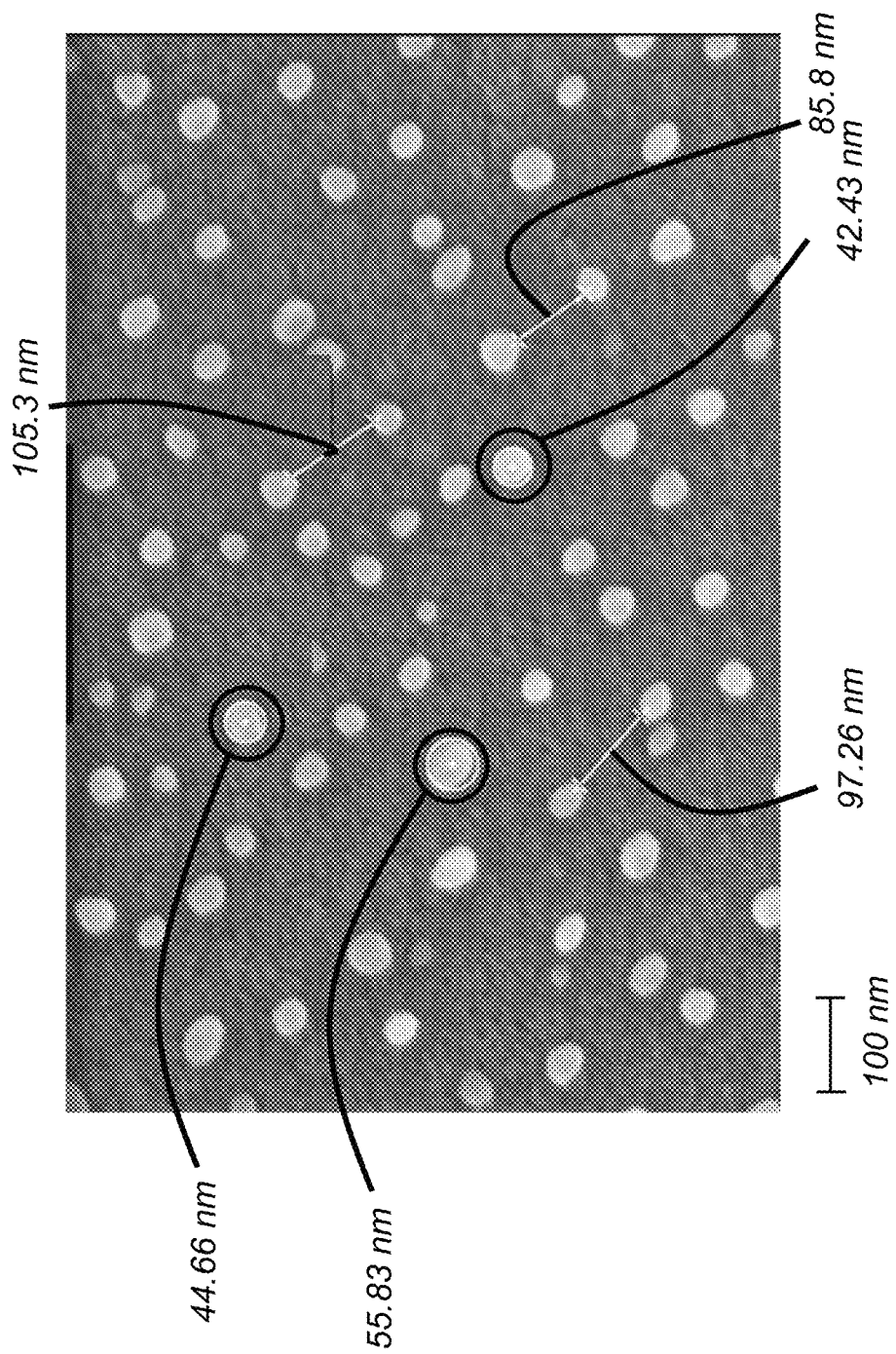
FIG. 5 is a SEM micrograph showing generation of Ag-nanoparticles (NP).

FIG. 5 is a scanning electron microscope (SEM) micrograph showing generation of Ag-nanoparticles (NP), using flash annealing methods as described herein. Dimensions of particular interest for plasmonic response include (i) size of the NPs generated, typically given in radius values; (ii) relative consistency and uniformity of dimensional results; and (iii) distance between NPs; and overall distribution.

Figure 6:
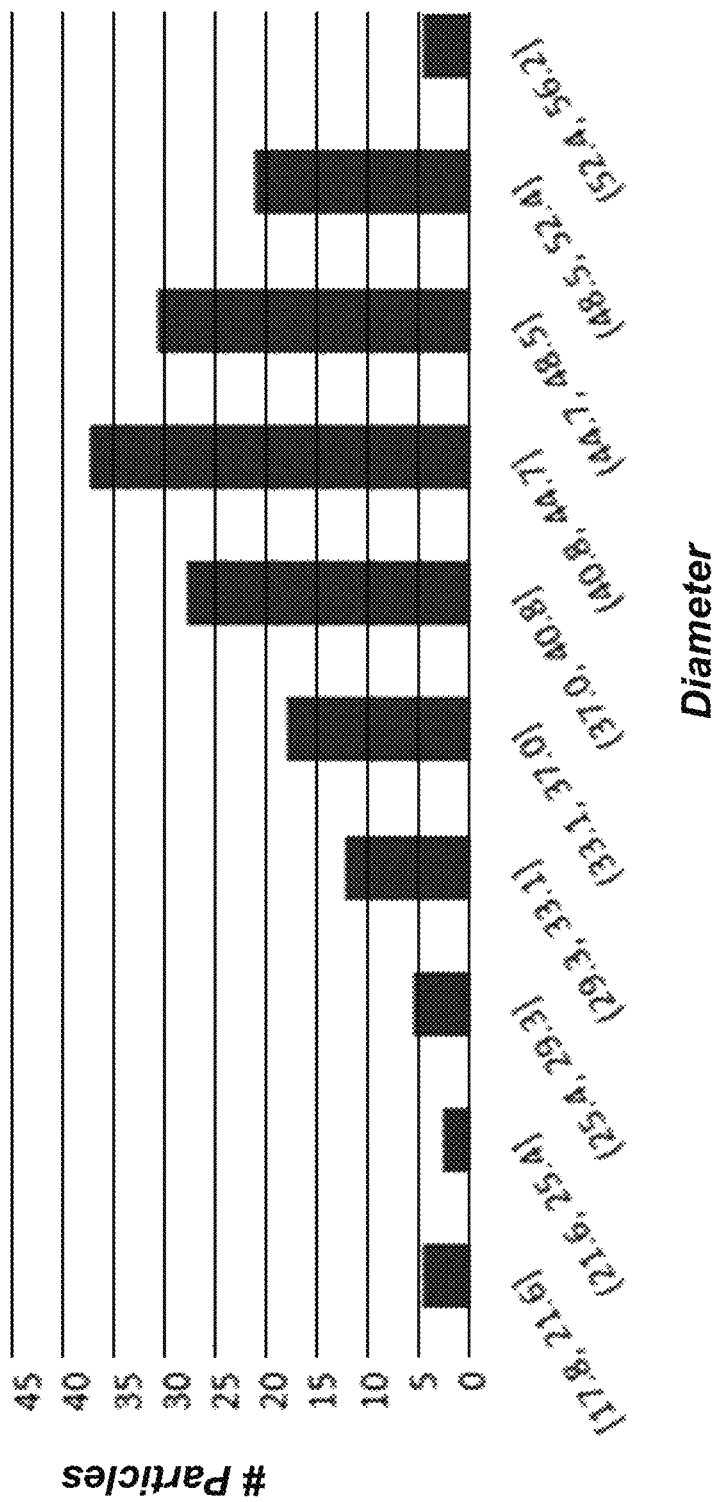
FIG. 6 is a graph providing a histogram of particle diameter distribution for a representative sampling of the fabrication surface.

FIG. 6 is a graph providing a histogram of particle diameter distribution for nanoparticles (NPs) formed using flash lamp annealing, for a representative sampling of the fabrication surface. Diameter ranges are in units of nanometers (nm). As can be seen from this data, there is a relatively high level of control that can be exercised for uniformity in nanoparticle formation using the FLA technique. As a particular feature, the Applicant has been able to exhibit further improvement in performance, as well as increased efficiency, by applying FLA energy onto a moving substrate, rather than requiring that the substrate be stationary during the treatment period. As noted previously, data of interest include not only particle diameter for the NPs, but also particle density, which can be measured in terms of NP population over a region and average distance between NPs, as was indicated in FIG. 5.

Figure 7A:
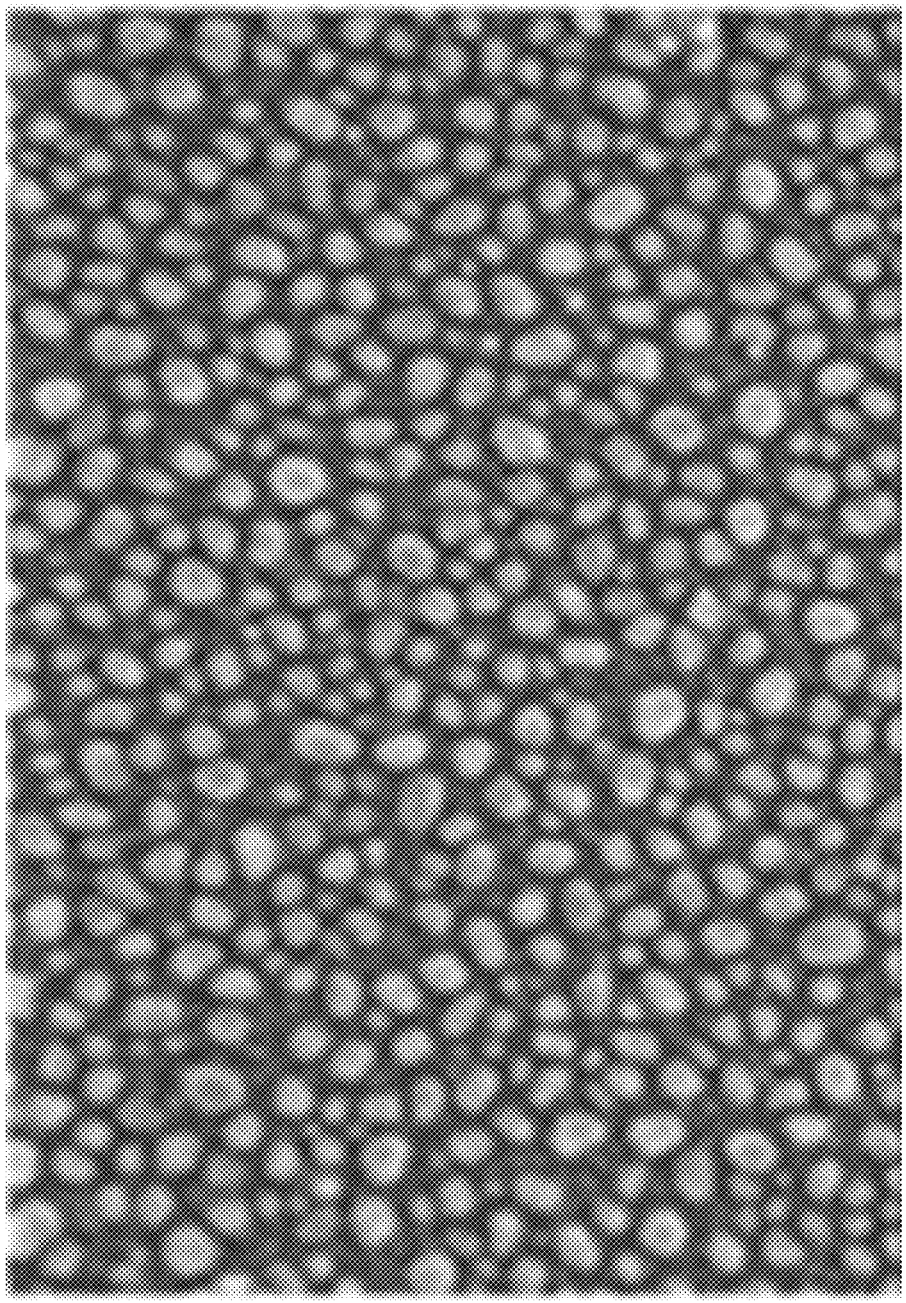
FIG. 7A shows an SEM for another example of nanoparticles formed using the method and apparatus described herein.
Figure 7B:
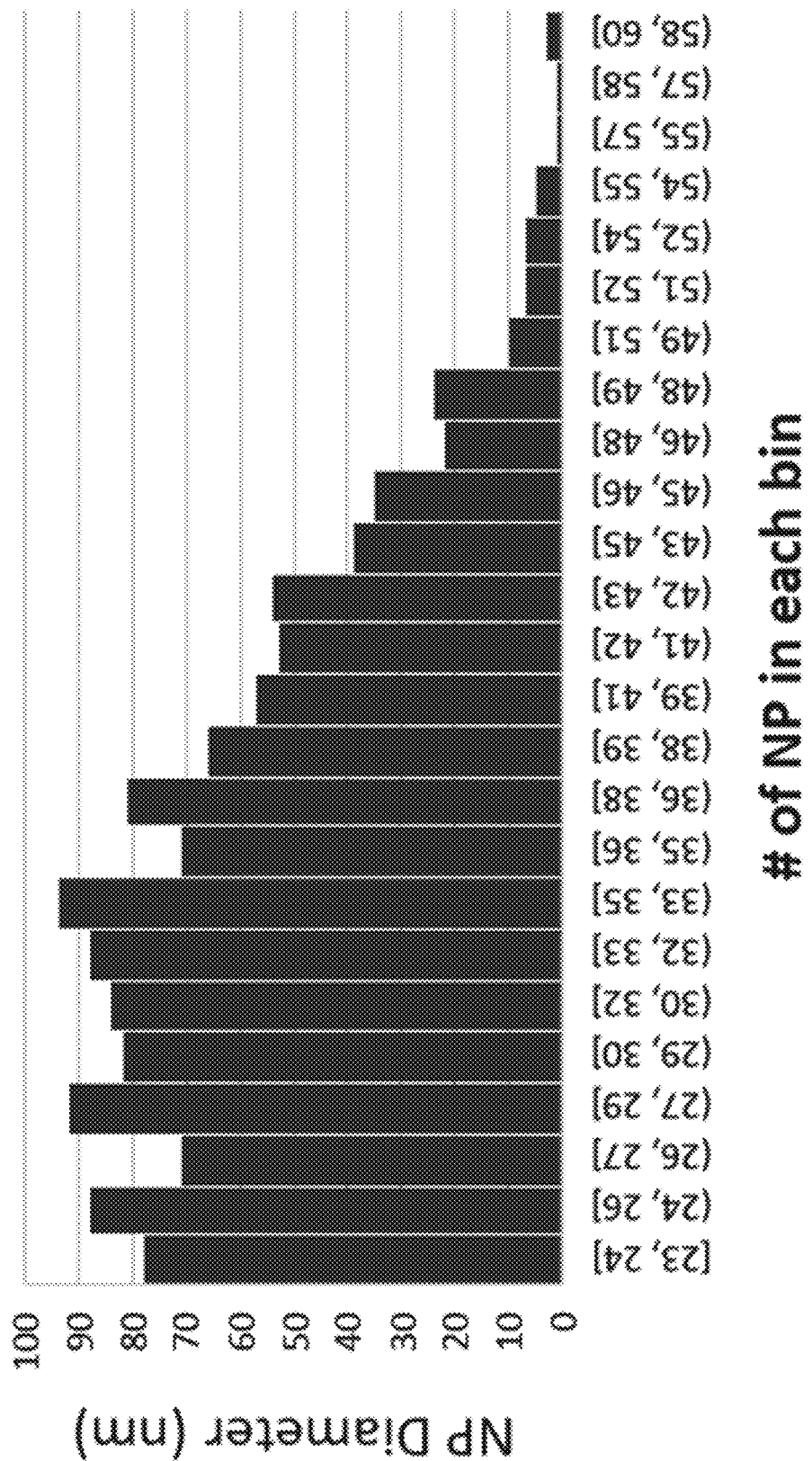
FIG. 7B shows a histogram corresponding to the image in FIG. 7A.

FIG. 7A shows a scanning electron microscope (SEM) image and FIG. 7B corresponding histogram results for another example of nanoparticles formed using the methods and fabrication apparatus described herein. In an SEM image 70, silver (Ag) NPs can provide small sizes that are at least relatively uniform. NPs can be formed from a thin layer of applied material such as a sputtered layer with thickness close to 4.0 nm. The NPs formed onto a thin layer, using FLA and a moving substrate, can have a relatively uniform size distribution, such as substantially (more than 80%, for example) of the NPs having diameters within about 25% of a median value, for example. Factors contributing to NP size and distribution, when using FLA techniques with the continuous movement provided in the apparatus 10 of FIG. 1, include duration and intensity of exposure energy flashes as well as the overall rate of speed of transport through the flash lighting chamber. For the FIGS. 7A and 7B results, 12 flashes were used, with the initially 4 nm coated surface moving beneath the FLA lamp(s) at a transport speed of 0.13 m/min. It can be appreciated that, unlike conventional NP generation and application methods, the approach employed by the Applicant for in situ NP generation onto a moving medium allows control of a number of factors for varying NP size and distribution, including bulk flash lamp pulse energy, pulse duration and duty cycle, and substrate transport speed.

Figure 8A:
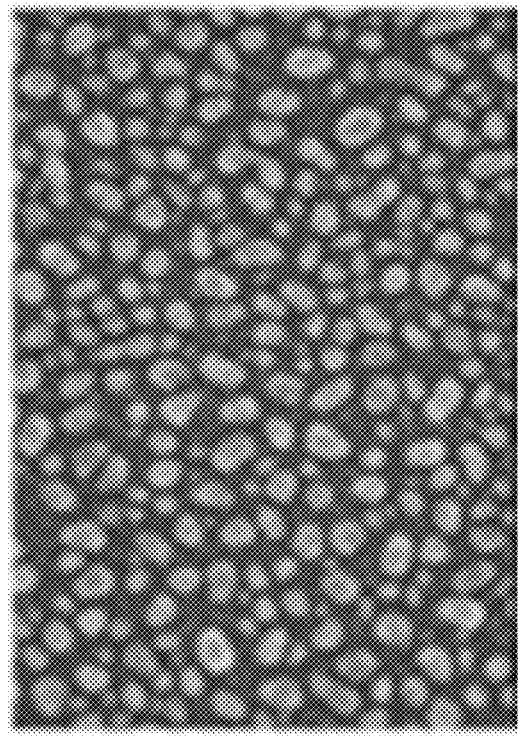
FIGS. 8A-8E show SEM (Scanning Electron Microscope) images of various results obtained using FLA exposure in the system of the present disclosure.

FIGS. 8A-8E show SEM (Scanning Electron Microscope) images of various results obtained using FLA exposure in the system of apparatus 10. FIG. 8A is an SEM image showing NP results from conditioning a 4.7 nm (average) thickness sputtered layer of Ag using the FLA processing and transport apparatus described herein. The NPs were formed by the dewetting process, applying 4 flashes of exposure light energy onto a surface moving at 0.4 meters per minute (m/min). Nanoparticles thus formed in this example exhibit a nominal average size of about 50 nm.

Figure 8B:
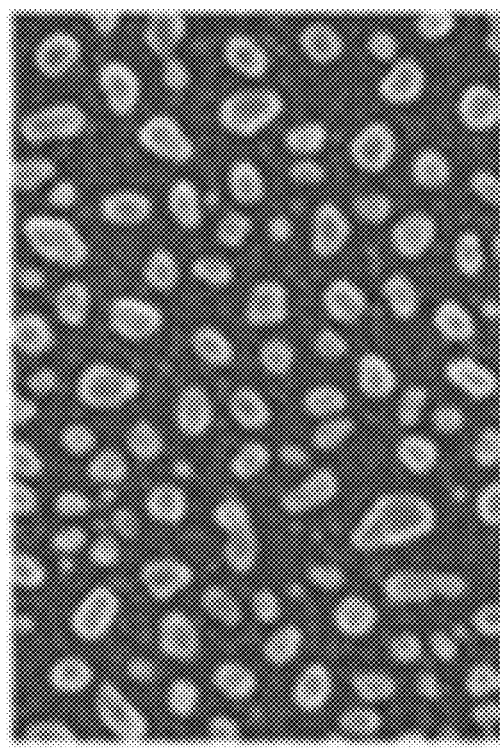

FIG. 8B is an SEM image showing NP results from conditioning a 4.7 nm (average) thickness sputtered layer of Ag using the FLA processing and transport apparatus described herein. The NPs were formed by the dewetting process, applying 8 flashes of exposure light energy onto a surface moving at 0.2 meters per minute (m/min). Nanoparticles thus formed in this example exhibit a nominal average size of about 64 nm.

Figure 8C:
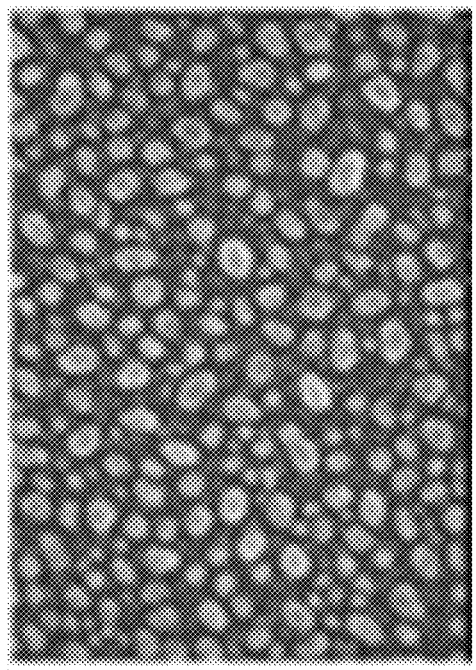

FIG. 8C is an SEM image showing NP results from conditioning a 4.7 nm (average) thickness sputtered layer of Ag using the FLA processing and transport apparatus described herein. The NPs were formed by the dewetting process, applying 12 flashes of exposure light energy onto a surface moving at 0.13 meters per minute (m/min). Nanoparticles thus formed in this example exhibit a nominal average size of about 60 nm.

Figure 8D:
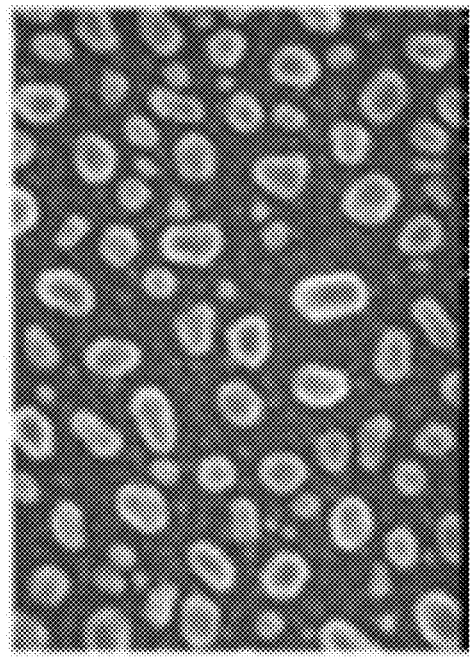

FIG. 8D is an SEM image showing NP results from conditioning a 6.5 nm (average) thickness sputtered layer of Ag using the FLA processing and transport apparatus described herein. The NPs were formed by the dewetting process, applying 12 flashes of exposure light energy onto a surface moving at 0.13 meters per minute (m/min). Nanoparticles thus formed in this example exhibit a nominal average size of about 100 nm.

Figure 8E:
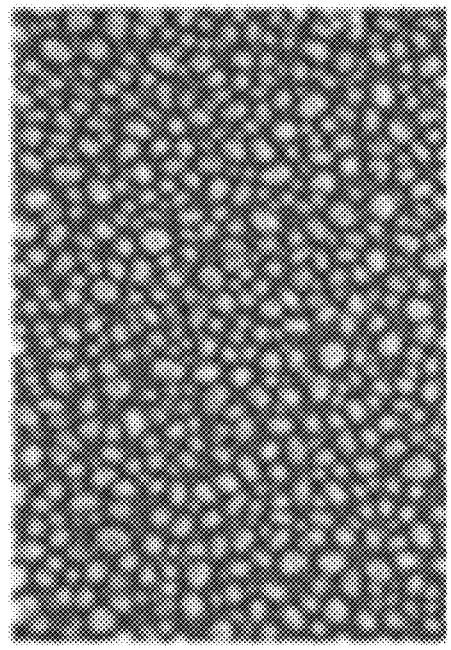

FIG. 8E is an SEM image showing NP results from conditioning a 4.0 nm (average) thickness sputtered layer of Ag using the FLA processing and transport apparatus described herein. The NPs were formed by the dewetting process, applying 12 flashes of exposure light energy onto a surface moving at 0.13 meters per minute (m/min). Nanoparticles thus formed in this example exhibit a nominal average size of about 40 nm.

FIG. 9 is a table that lists some exemplary parameters used in conditioning the TCO for photonic down-conversion and for generating nanoparticles for plasmonic response, according to an embodiment of the present invention. Width of an individual FLA emitter, perpendicular to the substrate motion direction, can be nominally 30 mm. The flash time, listed as delta flash, can be 1.129 seconds. Relative thicknesses of deposited TCO (AZO) and plasmonic metal (Ag) are shown by way of example. Values for different executions of the process are shown. Values in the right-hand columns are those used to generate the nanoparticles shown by way of example in image 70 of FIG. 7A. As was shown in the examples of FIGS. 8A through 8E, variations in layer thickness, pulse width and number, transport speed, and applied energy overall corresponds to variation in nanostructure size and distribution.

Deposition of flash lamp energy at pulse durations described herein has been shown to yield an efficient and accelerated annealing process over previous methods known in the art.

Precise control of NP size and of the spacing between the distributed nanoparticles that are fabricated by the FLA-activated dewetting process described herein can form vertical cavities within the substrate ("vertical" extending in a direction generally orthogonal to the plane of layers and of the PV device surface as shown in FIG. 2). Resonance of the light signal within the cavities can result in increased coherence of the light, at frequencies (wavelengths) that relate to the overall distribution and vertical distance of these cavities. In quantum matching applications, the relative concentration and distribution of nanoparticles within each of one or more layers of the photonic structure can impact both the index of refraction of the layers and the range of spectral shifting that is obtained.

FLA Hardware

Figure 10:
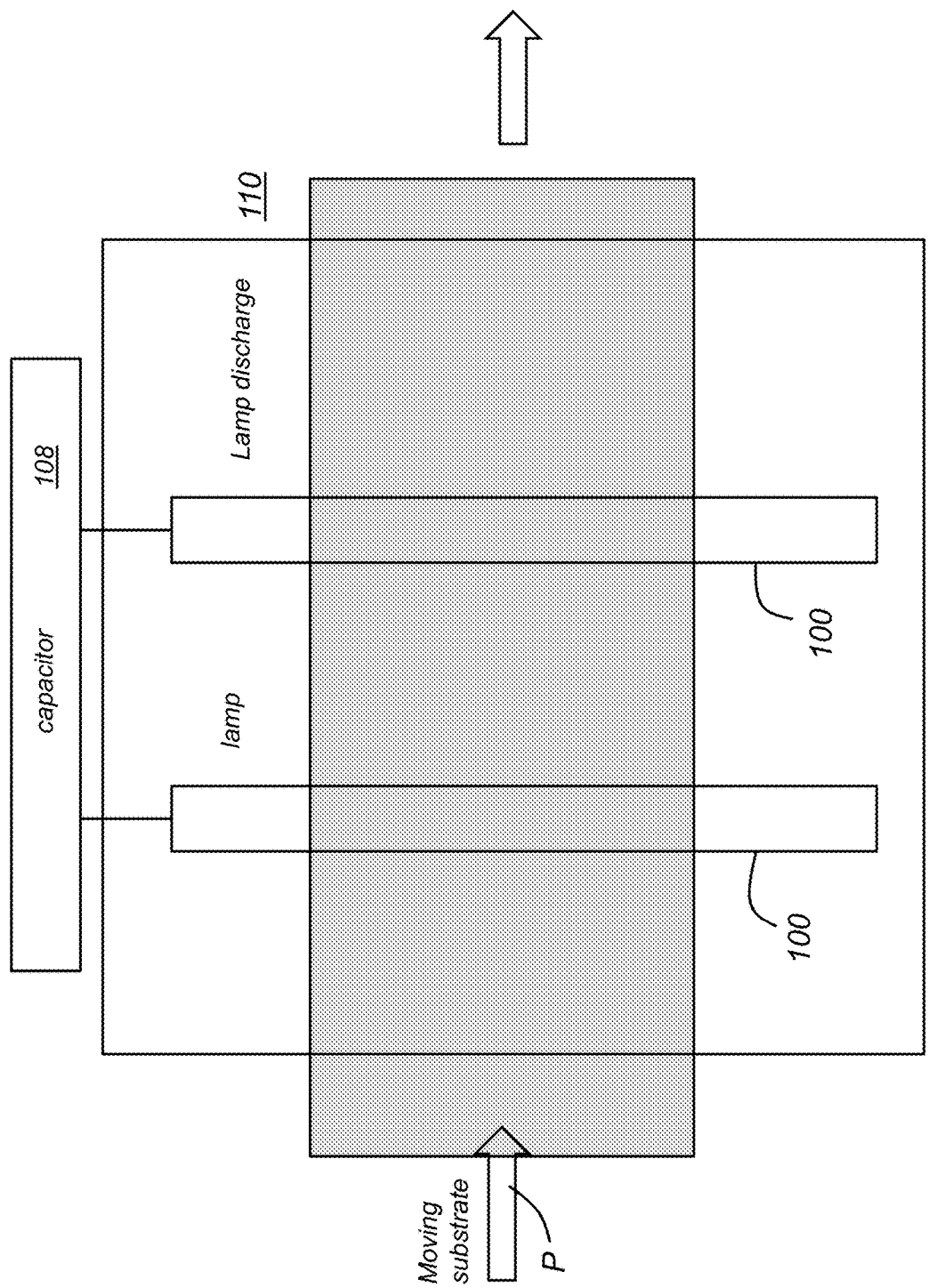
FIG. 10 is a perspective view that shows a representative flash lamp annealing (FLA) station according to an embodiment of the present disclosure.

FIG. 10 is a perspective view that shows a representative flash lamp annealing (FLA) station in an annealing chamber 110, according to an embodiment of the present disclosure. In FLA chamber 110, two or more high-energy lamps 100 can be staggered across the transport path P of the moving substrate. A fused silica window can be provided to maintain vacuum within FLA chamber 110 during and throughout exposure. This arrangement allows application of high-energy light onto a moving medium, thus reducing the size and energy requirements of FLA procedure.

Potential energy of the lamps can be 3.2 kV with 2.7 msec pulses. According to an embodiment, for a given thickness of Ag coating, seven (7) pulses can be used to generate, via dewetting, nanoparticles averaging 100 nm in size, with a total exposure time of 19 msec (2.7 msec times 7=18.9 msec). According to an embodiment of the present disclosure, nominal lamp width is 30 mm. A bank having an arrangement with multiple lamps 100 can be used. A capacitor 108 can be used to build up and store charge for each pulse.

Figure 11A:
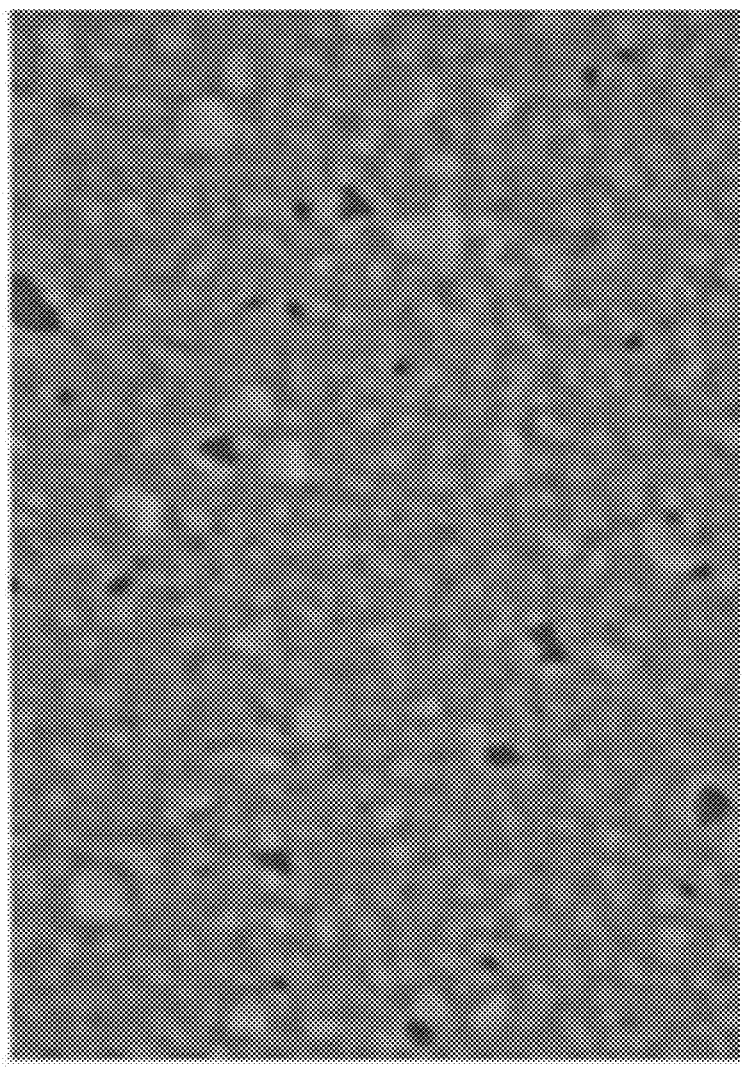
FIGS. 11A, 11B, and 11C are microscope images showing progressive dewetting of an Ag layer deposited on an AZO substrate under increasing levels of flash lamp annealing.
Figure 11B:
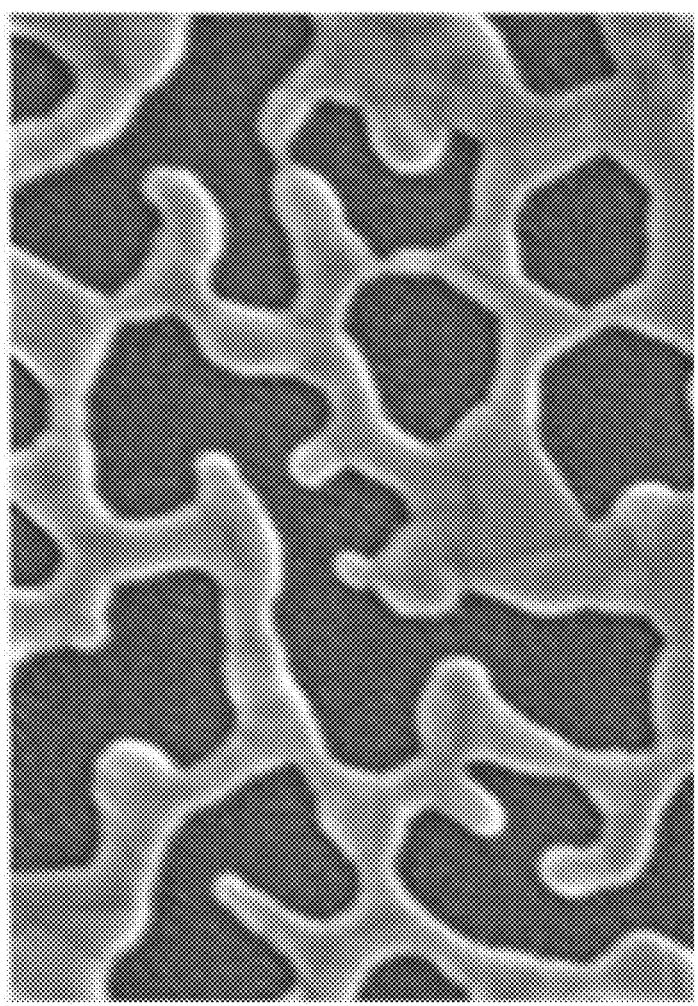
Figure 11C:
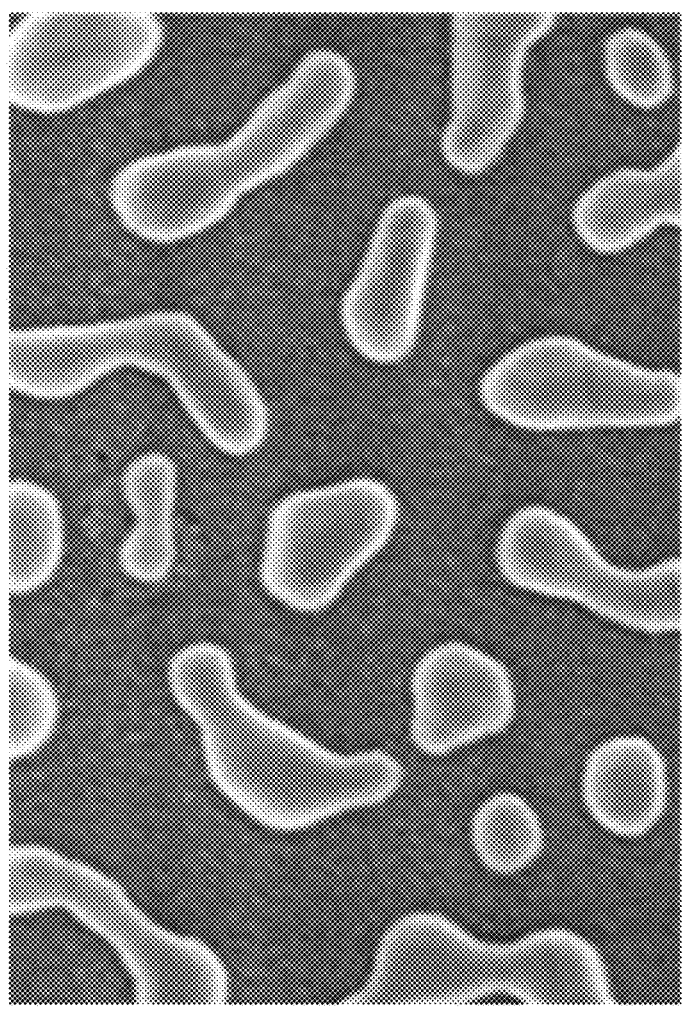

FIGS. 11A-C show progressive results for a dewetting sequence, according to an embodiment. Specifically, FIGS. 11A, 11B, and 11C are scanning electron-microscope images showing progressive dewetting of an Ag layer deposited on an AZO substrate under increasing levels of flash lamp annealing. FIG. 11A shows a seed layer, as initially deposited and before FLA exposure. FIG. 11B shows effects of FLA exposure of 2.0 kV energy level at 25% duty cycle. FIG. 11C shows exemplary nanoparticles formed from continued FLA processing, with nominal NP diameters from 100-300 nm and average spacing between NPs ranging from 100-200 nm.

Whereas, the devices and methods have been described in relation to the drawings and claims, it should be understood that other and further modifications, apart from those shown or suggested herein, may be made within the spirit and scope of this disclosure. For example, additional program logic and sensors can be provided for obtaining and responding to feedback from processing as the substrate moves along the transport path.

The apparatus of the present disclosure has been described in detail with particular reference to a presently preferred embodiment, but it will be understood that variations and modifications can be effected within the spirit and scope of the disclosure. The presently disclosed embodiments are therefore considered in all respects to be illustrative and not restrictive. The scope of the invention is indicated by any appended claims, and all changes that come within the meaning and range of equivalents thereof are intended to be embraced therein.

The invention claimed is:

1. A method comprising:
depositing a seed layer of a transparent conductive oxide onto a substrate;
depositing a layer of a plasmonic metal onto the transparent conductive oxide layer;
and
forming nanoparticles from the deposited metal by:
transporting the substrate along a transport path;
as the substrate is moving, energizing one or more flash lamps disposed along the transport path to apply a plurality of light pulses that impart a dewetting energy to the deposited metal layer.

2. The method of claim 1 wherein depositing comprises sputtering.

3. The method of claim 1 wherein the light pulses are configured to further condition the transparent conductive oxide for photonic wavelength conversion.

4. The method of claim 1 wherein the transparent conductive oxide is aluminum-doped zinc oxide.

5. The method of claim 1 wherein the transparent conductive oxide is indium tin oxide.

6. The method of claim 1 wherein the metal is silver.

7. The method of claim 1 wherein the transport path further translates the substrate through one or more stations that are configured to form a distributed Bragg reflector stack onto the substrate by adding alternating thin layers of dielectric materials onto the moving substrate.

8. The method of claim 1 wherein the nanoparticles that are formed provide plasmonic response to light at visible frequencies.

9. The method of claim 1 further comprising coupling the treated metal layer to a solar cell.

10. A method for forming a film comprising:
transporting the substrate along a transport path within a vacuum chamber;
depositing a seed layer of aluminum zinc oxide onto the moving substrate;
depositing a layer of a plasmonic metal onto the moving seed layer;
forming nanoparticles configured to enhance the plasmon resonance of the substrate, by energizing one or more flash lamps disposed along the transport path onto the moving substrate to impart a pulsed dewetting energy onto the deposited metal layer;
and
depositing a transparent encapsulating layer onto the deposited metal layer.

11. The method of claim 10 further comprising coupling the film to a solar cell.

12. The method of claim 10 further comprising coupling the film to a Bragg reflector stack.

13. The method of claim 10 wherein the flash lamps extend across the moving substrate in a direction perpendicular to substrate travel along the transport path.

14. An apparatus comprising:
a vacuum chamber that encloses a transport path for a moving substrate;
a first sputtering station configured to deposit a transparent conductive oxide onto the substrate as it moves along the transport path;
a second sputtering station configured to deposit a plasmonic metal adjacent to the transparent conductive oxide on the substrate as it moves along the transport path;
a plurality of flash lamps configured to direct pulsed light onto the moving substrate at a combined energy level sufficient to form a layer of nanoparticles of the plasmonic metal;
and
an encapsulation station that deposits an encapsulating layer onto the layer of nanoparticles.

15. The apparatus of claim 14 further comprising one or more additional sputtering stations configured to deposit additional dielectric optical layers onto the moving substrate.

16. The apparatus of claim 14 wherein the transparent conductive oxide is aluminum-doped zinc oxide.

17. The apparatus of claim 14 further comprising a control logic processor configured to control the processing of the substrate as it moves through the stations and flash lamps of the vacuum chamber.

18. The apparatus of claim 14 further comprising a pre-treatment station that performs a plasma etch on the substrate.

19. The apparatus of claim 14 wherein multiple moving substrates are processed simultaneously.

20. The apparatus of claim 14 wherein the substrate is in web form.

* * * * *